US012638776B2

(12) United States Patent
    Tapily

(10) Patent No.:    US 12,638,776 B2
(45) Date of Patent:     May 26, 2026

---

(54) DRY RESIST SYSTEM AND METHOD OF USING

(71) Applicant: Tokyo Electron Limited, Tokyo (JP)

(72) Inventor: Kandabara Tapily, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 832 days.

(21) Appl. No.: 17/834,699

(22) Filed: Jun. 7, 2022

(65) Prior Publication Data

US 2022/0404713 A1     Dec. 22, 2022

Related U.S. Application Data

(60) Provisional application No. 63/212,000, filed on Jun. 17, 2021.

(51) Int. Cl.
  *G03F 7/00*        (2006.01)
  *G03F 7/075*      (2006.01)

(52) U.S. Cl.
  CPC ........ *G03F 7/70033* (2013.01); *G03F 7/0752* (2013.01)

(58) Field of Classification Search
  None
  See application file for complete search history.

(56) References Cited

U.S. PATENT DOCUMENTS 7,214,548 B2 *   5/2007   Fayaz ................. H10P 72/0616
                                      702/85

| | | |
|---|---|---|
| 8,465,903 B2 | 6/2013 | Weidman et al. |
| 8,536,068 B2 | 9/2013 | Weidman et al. |
| 8,574,810 B2 | 11/2013 | Fonseca et al. |
| 9,778,561 B2 | 10/2017 | Marks et al. |
| 9,829,805 B2 | 11/2017 | Michaelson et al. |
| 9,996,004 B2 | 6/2018 | Smith et al. |
| RE47,483 E * | 7/2019 | Resnick .............. H10P 72/0441 |
| 10,514,598 B2 | 12/2019 | Marks et al. |

(Continued)

FOREIGN PATENT DOCUMENTS

| KR | 20060109022 A | 10/2006 |
|---|---|---|
| TW | 202006168 A | 2/2020 |

(Continued)

OTHER PUBLICATIONS

"Assembling eGaN FETs and Integrated Circuits," Clean Track MARK 8, Application Note: AN009, photonicmicrodevices.com, Jun. 15, 1998, 11 pages.

(Continued)

*Primary Examiner* — Jonathan Johnson
*Assistant Examiner* — Andrew Preston Traywick
(74) *Attorney, Agent, or Firm* — Slater Matsil, LLP

(57)        ABSTRACT

A method of operating a manufacturing platform includes moving a substrate through the manufacturing platform using one or more transfer modules. A dry resist is deposited on the substrate using a resist deposition module of the manufacturing platform. The substrate is examined for distortion with a metrology system that is part of a transfer module. The dry resist is exposed to UV or EUV radiation using an exposure tool of the manufacturing platform. Exposed or unexposed portions of the dry resist are removed using an etch module of the manufacturing platform.

20 Claims, 8 Drawing Sheets

(56)                References Cited

U.S. PATENT DOCUMENTS

| 10,727,075 | B2 | 7/2020 | Kim et al. | |
|---|---|---|---|---|
| 10,732,505 | B1 | 8/2020 | Meyers et al. | |
| 10,831,096 | B2 | 11/2020 | Marks et al. | |
| 2007/0023390 | A1 | 2/2007 | Kumar | |
| 2007/0097383 | A1 | 5/2007 | Nguyen et al. | |
| 2015/0221519 | A1 | 8/2015 | Marks et al. | |
| 2018/0004083 | A1 | 1/2018 | Marks et al. | |
| 2019/0079411 | A1* | 3/2019 | Cekli | G03F 7/70783 |
| 2019/0212656 | A1 | 7/2019 | Dai et al. | |
| 2020/0026177 | A1* | 1/2020 | Moradian | G03F 1/22 |
| 2020/0083080 | A1* | 3/2020 | Clark | H01L 21/76834 |
| 2020/0083090 | A1* | 3/2020 | Chan | H10D 30/024 |
| 2020/0150532 | A1* | 5/2020 | Goldfarb | H01L 21/0273 |
| 2021/0013034 | A1* | 1/2021 | Wu | G03F 7/0042 |
| 2021/0013037 | A1* | 1/2021 | Sun | G03F 7/0752 |

FOREIGN PATENT DOCUMENTS

| WO | 2019182913 | A1 | 9/2019 |
|---|---|---|---|
| WO | 2019217749 | A1 | 11/2019 |
| WO | 2020172481 | A1 | 8/2020 |
| WO | 2020264158 | A1 | 12/2020 |

OTHER PUBLICATIONS

Cardineau et al., "EUV Resists based on Tin-Oxo Clusters," Advances in Patterning Materials and Processes XXXI, Proc. of SPIE vol. 9051 90511B-1, downloaded from http://proceedings.spiedigitallibrary.org/ on May 20, 2015, 12 pages.

Hinsberg et al., "A Numeric Model for the Imaging Mechanism of Metal Oxide EUV Resists," Inpria Corp., Columbia Hill Technical Consulting, EUVL Workshop, Jun. 14, 2018, 21 pages.

Ober et al., "EUV Photolithography: Resist Progress and Challenges," Proceedings of SPIE, SPIE Advanced Lithography, 2018, SPIEDigitalLibrary.org/conference proceedings-of-spie, vol. 10583, Mar. 19, 2018, 14 pages.

International Search Report for PCT/US2022/032328 dated Jun. 6, 2022, 10 pages.

* cited by examiner

TEL-200639US02

100

102

100

104

105

107

100

108

107

100

Metal Precursor

Oxidizer

Inert gas

Time

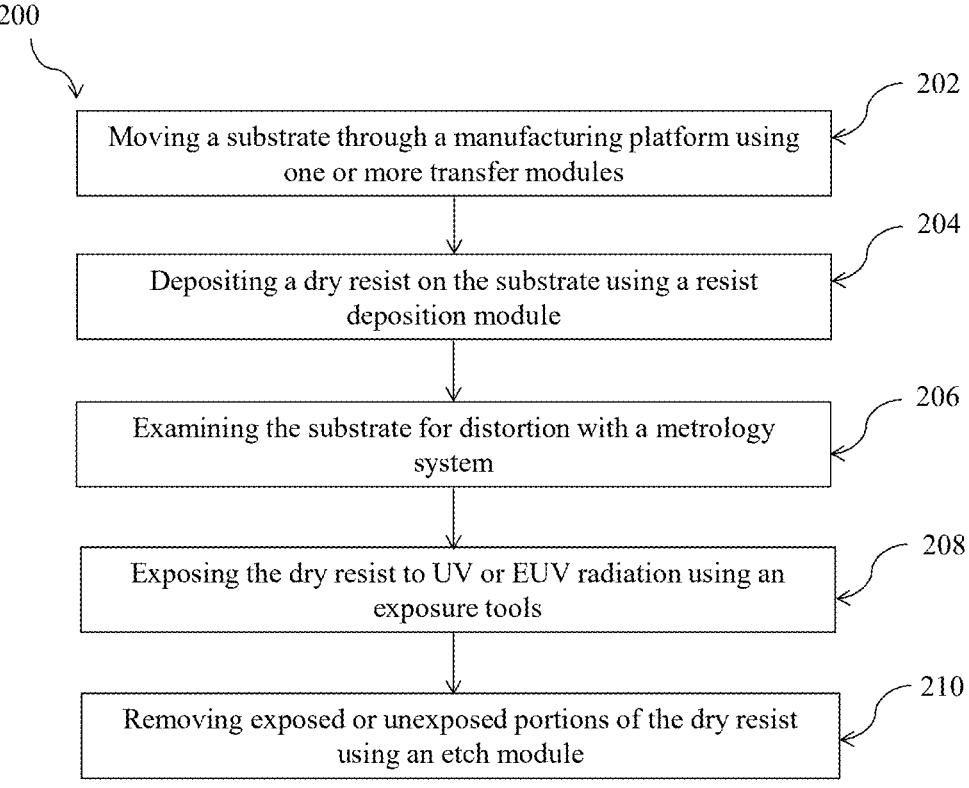

202

Moving a substrate through a manufacturing platform using one or more transfer modules

204

Depositing a dry resist on the substrate using a resist deposition module

206

Examining the substrate for distortion with a metrology system

208

Exposing the dry resist to UV or EUV radiation using an exposure tools

210

Removing exposed or unexposed portions of the dry resist using an etch module

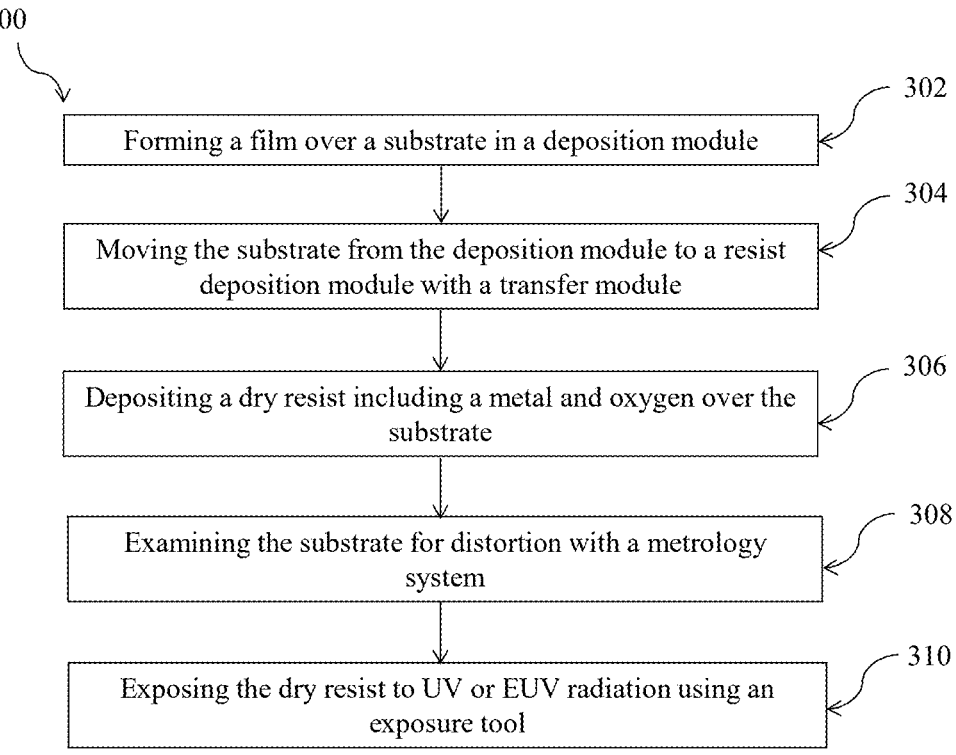

302
Forming a film over a substrate in a deposition module

304
Moving the substrate from the deposition module to a resist deposition module with a transfer module 306
Depositing a dry resist including a metal and oxygen over the substrate 308
Examining the substrate for distortion with a metrology system 310
Exposing the dry resist to UV or EUV radiation using an exposure tool

FIG. 6

DRY RESIST SYSTEM AND METHOD OF USING

CROSS-REFERENCE TO RELATED APPLICATIONS

This application claims the benefit of U.S. Provisional Application No. 63/212,000, filed on Jun. 17, 2021, which application is hereby incorporated by reference herein in its entirety.

TECHNICAL FIELD

The present invention relates to the field of semiconductor manufacturing and semiconductor manufacturing systems, and more particularly, to a dry resist system and method forming a patterned mask containing a dry resist.

BACKGROUND

Photolithography is commonly used to pattern thin films during semiconductor processing, where photons are emitted from a light source onto a photosensitive photoresist to initiate a chemical reaction in the photoresist. Thereafter, the photoresist is developed and exposed or unexposed portions of the photoresist are removed to form a pattern or a mask.

Scaling of semiconductor devices has enabled significant technological advances, including advanced lithographic techniques such as immersion lithography. Extreme Ultraviolet (EUV) radiation can be used for providing improved pattern resolution in advanced integrated circuits where reduction in feature sizes is required. Common EUV photoresists are polymer-based chemically amplified resists (CARs) that are deposited on substrates using liquid-based spin-on techniques that consume a significant amount of complex precursors. Recently, inorganic-based resists have received interest as they may be patterned using EUV radiation and can offer the high etch resistance and etch selectivity needed for semiconductor manufacturing.

SUMMARY

In accordance with an embodiment, a manufacturing platform includes: one or more transfer modules for moving a substrate through the manufacturing platform, where a transfer module of the one or more transfer modules includes a metrology system configured to measure distortion of the substrate; one or more resist deposition modules for depositing a dry resist on the substrate; one or more exposure tools for exposing the dry resist to UV or EUV radiation; and one or more etch modules for removal of exposed or unexposed portions of the dry resist by a dry etch process to form a mask on the substrate.

In accordance with another embodiment, a method of operating a manufacturing platform includes: moving a substrate through the manufacturing platform using one or more transfer modules; depositing a dry resist on the substrate using a resist deposition module of the manufacturing platform; examining the substrate for distortion with a metrology system, where the metrology system is part of a transfer module of the one or more transfer modules; exposing the dry resist to UV or EUV radiation using an exposure tool of the manufacturing platform; and removing exposed or unexposed portions of the dry resist using an etch module of the manufacturing platform.

In accordance with yet another embodiment, a method of an exposure process includes: forming a film over a substrate in a deposition module, where the film is formed in vacuum; moving the substrate from the deposition module to a resist deposition module with a transfer module; depositing a dry resist over the substrate in the resist deposition module, the dry resist including a metal and oxygen; examining the substrate for distortion with a metrology system, where the metrology system is part of the transfer module; and moving the substrate to an exposure tool with the transfer module, where the exposure tool exposes the dry resist to UV or EUV radiation, where the substrate has been in vacuum from forming the film to exposing the dry resist.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates flow rates of a deposition process for forming a dry resist, in accordance with some embodiments;

FIG. 5 is a flow chart of a method for operating a manufacturing platform, in accordance with some embodiments; and FIG. 6 is a flow chart of a method for an exposure process, in accordance with some embodiments.

Figure 1:
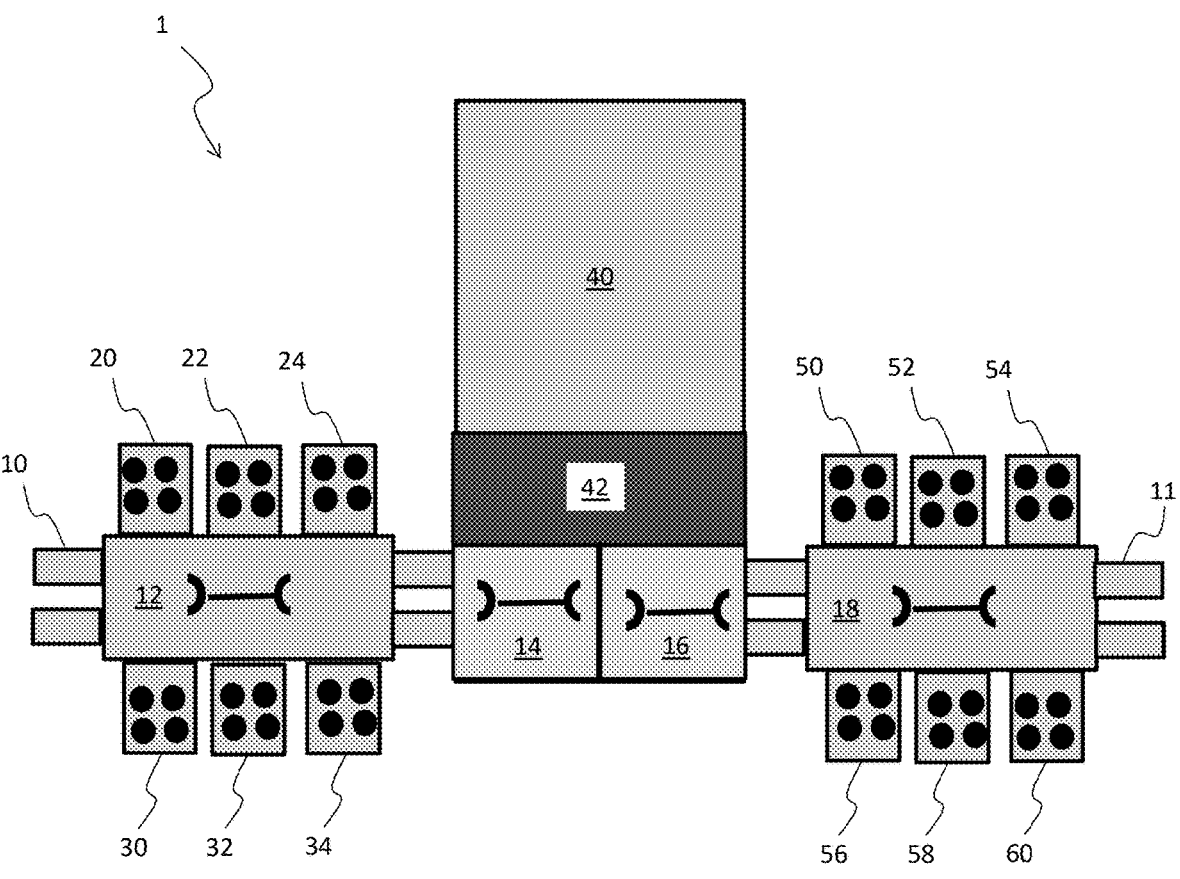
FIG. 1 is a schematic illustration of a manufacturing platform for processing multiple substrates, in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments. The references used herein are provided merely for convenience and hence do not define the extent of protection or the scope of the embodiments.

According to one or more embodiments of the present disclosure, this application relates to systems and methods for forming a patterned mask containing a dry resist for EUV patterning. EUV lithography can extend current photolithographic technology beyond its optical limits by moving to smaller imaging source wavelengths in order to pattern features with small critical dimensions. EUV light sources with wavelengths of, for example, approximately 13.5 nm can be used for leading-edge lithography tools, also referred to as scanners. The EUV radiation is strongly absorbed in a wide range of solid materials and gases and therefore the radiation paths need to operate in a vacuum to avoid absorption by ambient gases such as $H_2O$ and $O_2$.

EUV lithography typically makes use of an organic hardmask (e.g., an ashable hardmask of PECVD amorphous hydrogenated carbon) that is patterned using a conventional photoresist process. During photoresist exposure, EUV radiation is absorbed in the resist and in the substrate below. This produces highly energetic photoelectrons (e.g., having energies of about 100 eV). The highly energetic photoelectrons in turn produces a cascade of low-energy secondary electrons (e.g., having energies of about 10 eV) that diffuse laterally by several nanometers. These low-energy secondary electrons increase the extent of chemical reactions in the resist, which increases its EUV dose sensitivity. However, a secondary electron pattern that is random in nature is superimposed on the optical image. This unwanted secondary electron exposure results in loss of resolution, observable line edge roughness (LER) and linewidth variation in the patterned resist. These defects are replicated in the material to be patterned during subsequent pattern transfer etching.

Metal oxide materials (e.g., containing antimony (Sb) metal) have been found to be particularly suitable for direct EUV photopatterning as they strongly absorb EUV light. Unlike an insulator such as a photoresist, a metal oxide material is less susceptible to secondary electron exposure effects since the secondary electrons can quickly lose energy and thermalize by scattering with conduction electrons.

Exemplary Sb-containing precursors can be alkylamine based (e.g., tris(dimethylamido)antimony, $(Me_2N)_3Sb$), alkoxide-based (e.g., $Sb(OEt)_3$), or halide-based (e.g., $SbCl_3$). Exemplary oxygen-containing precursors include glycerol, ethylene glycol, ethanol, isopropyl alcohol, quinone, $O_3$, CO, and $CO_2$. Further, a halogen (e.g, F) may be added to the one or more of the process gases to enhance adsorption. Additional metal oxide films can include methacrylates (MAA) of Sb, Hf, Zr and Zn, such as ZrMAA, SbMAA, SbMAA:F, HfMAA, ZnMAA, and ZnMAA:F.

Embodiments of the disclosure describe manufacturing platforms and methods for depositing dry resists containing metal oxide films and metal alkoxide films that may be used as a dry resist for EUV patterning in manufacturing of integrated circuits. In some examples, the metal oxide films and the metal alkoxide films can include tin (Sn), antimony (Sb), hafnium (Hf), zirconium (Zr), or zinc (Zn). The metal oxide films and the metal alkoxide films may further include additional chemical elements, including carbon, a halogen, or both.

Embodiments of the disclosure are described in the context of the accompanying drawings. Embodiments of manufacturing platforms for processing multiple substrates will be described using FIG. 1 through 2B. Embodiments of a fabrication process including formation, patterning, and development of a dry resist as a photoresist film will be described using FIGS. 3A-3D. Embodiments of a deposition process for forming a dry resist will be described using FIG. 4. Embodiments of a method for operating a manufacturing platform will be described using FIG. 5. Embodiments of a method for an exposure process will be described using FIG. 6.

Figure 2A:
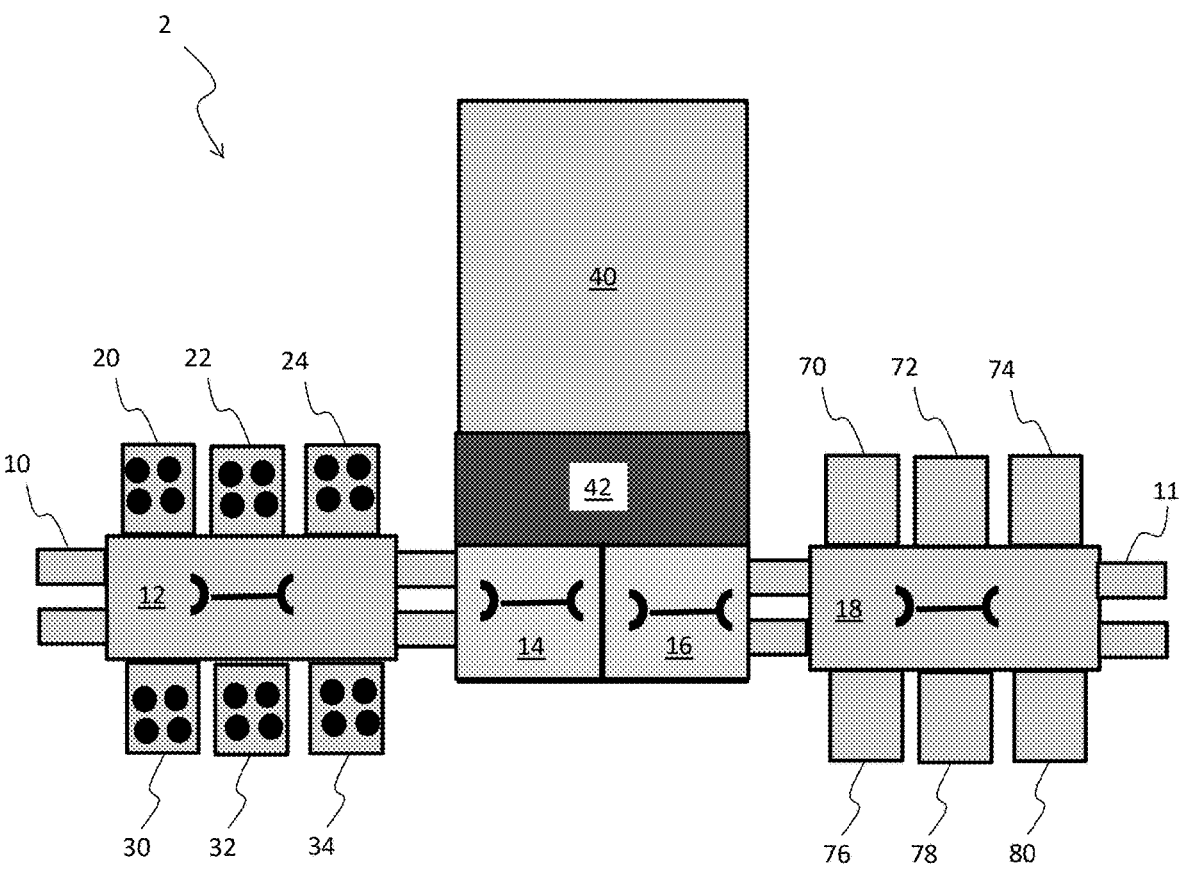
FIG. 2A is a schematic illustration of another manufacturing platform for processing multiple substrates, in accordance with an embodiment.
Figure 2B:
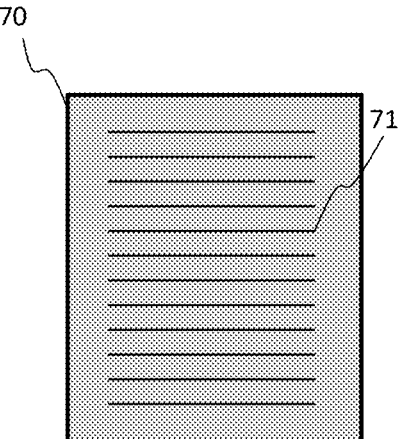
FIG. 2B is a schematic illustration of a mini-batch module of a manufacturing platform for processing multiple substrates, in accordance with an embodiment.

FIGS. 1 through 2B schematically illustrate manufacturing platforms and components thereof for processing multiple substrates, according to embodiments of the disclosure. The manufacturing platforms are configured for high throughput formation of inorganic dry resists and etching of the resists according to advanced patterning schemes (e.g., EUV photopatterning). The manufacturing platforms can be operated under vacuum conditions that prevent or reduce process induced variation due to air exposure, such as resist degradation.

FIG. 1 illustrates a manufacturing platform 1 in a cross-sectional view, in accordance with some embodiments. The manufacturing platform 1 includes an equipment front end module (EFEM) 10, transfer modules 12, 14, 16, and 18, and a plurality of processing modules. The processing modules may include one or more etch modules 20, 22, 24, one or more deposition modules 30, 32, 34, one or more exposure tools 40, one or more developer/bake modules 42, and one or more resist deposition modules 50, 52, 54, 56, 58, 60. The manufacturing platform 1 may reduce process-induced variation in substrates due to air exposure by performing processes in vacuum and transferring substrates between process chambers without breaking vacuum. By avoiding exposure of the substrates to air, resist degradation may be reduced or prevented. Operation of the manufacturing platform 1 may be automated (e.g., controlled by a controller such as a programmable computer), which may increase production throughput and reduce process variation by decreasing user intervention.

The equipment front end module (EFEM) 10 is used for introducing one or more substrates into the manufacturing platform 1. For example, the substrate may be a silicon wafer having a diameter in a range of 100 mm to 500 mm, such as a diameter of 150 mm, 200 mm, 300 mm, or 450 mm. However, the EFEM 10 may be used to introduce substrates of any suitable size into the manufacturing platform 1. The EFEM 10 may incorporate one or more cassettes holding the substrates (wafers). The EFEM 10 may be maintained at atmospheric pressure but purged with an inert gas to provide a clean environment.

One or more of the substrates may then be transferred into a transfer module (TM) 12 operated under vacuum conditions, such as through one or more load lock chambers (not shown). The multiple TMs 12, 14, 16, 18 may be interfaced for providing movement of a substrate through the manufacturing platform 1 through a desired process sequence. The process sequence may be automated and controlled by a controller of the manufacturing platform 1. The multiple TMs 12, 14, 16, 18 are coupled with a plurality of processing modules. Such processing modules may provide various different processing steps or functions and may include one or more etch modules 20, 22, 24, one or more deposition modules 30, 32, 34, one or more exposure tools 40, one or more developer/bake modules 42, and one or more resist deposition modules 50, 52, 54, 56, 58, 60 for depositing a dry resist on the substrates. In one example, the one or more resist deposition modules 50, 52, 54, 56, 58, 60 may be multi-wafer modules, each of which are configured for simultaneously processing multiple substrates (e.g., 5 or less). Generally, each TM 12, 14, 16, 18 includes a chamber therein that houses a transfer robot that is capable of moving substrates through various gate valves and access or transfer ports into various processing modules or measurement modules while maintaining vacuum conditions around the substrates. The TMs 12, 14, 16, 18 may operate simultaneously to move multiple substrates under vacuum conditions between various processing modules or measurement modules to achieve enable high throughput in the manufacturing platform 1.

Further, one or more of the TMs 12, 14, 16, 18 may be configured for inspecting the substrate following a process. For example, in some embodiments one or more of the TMs 12, 14, 16, 18 comprises a metrology system that is configured to measure the substrate for distortion. The metrology system may include laser sensors, conformal chromatic sensors to detect distortion or bow of the substrate, optical metrology (e.g., for thickness measurement, roughness measurement, CD (critical dimension) measurement, or the like), infrared measurement (such as Fourier Transform IR) to measure carbon content, the like, or a combination thereof. If the substrate has a greater than desirable amount of distortion, the one of the one or more TMs 12, 14, 16, 18 may discard the substrate.

In some embodiments, the measurements of the metrology system may be used to correct distortion of the substrate in the one of the one or more TMs 12, 14, 16, 18. For example, actuators in the one of the one or more TMs 12, 14, 16, 18 may apply pressure to portions of the substrate (e.g., the edges of the substrate) to reduce distortion of the substrate detected by the metrology system. Distortion correction may be performed in the one or more TMs 12, 14, 16, 18 after any process steps (e.g., deposition, etching, exposure, development, baking or the like) that may cause or increase distortion of the substrate.

In one example, a film may be deposited on a substrate in one or more deposition modules 30, 32, 34. The film may subsequently be patterned using a patterned dry resist as a mask. The deposition modules 30, 32, 34 may process multiple substrates to enable high throughput in the manufacturing platform 1.

Next, the substrate may be transferred by the TMs 12, 14, 16, 18 into one or more resist deposition modules 50, 52, 54, 56, 58, 60 for depositing a dry resist on the substrates. The dry resist may be a metal oxide, a metal alkoxide film, a methacrylate (MAA) of Sb, Hf, Zr and Zn, the like, or a combination thereof. In some examples, the dry resist includes tin (Sn), antimony (Sb), hafnium (Hf), zirconium (Zr), or zinc (Zn). The dry resist may further include additional chemical elements, including carbon, a halogen, or both. The one or more resist deposition modules 50, 52, 54, 56, 58, 60 may deposit dry resists on multiple substrates simultaneously to enable high throughput in the manufacturing platform 1.

Next, the substrate may be transferred by the TMs 18 and 16 into one or more exposure tools 40 for exposing the dry resist to UV or EUV radiation. In some embodiments, the one or more exposure tools 40 use wavelengths in a range of a wavelength of a krypton-fluoride laser (248 nm) to an EUV wavelength (13.5 nm). The one or more exposure tools 4*o* may expose multiple substrates simultaneously to enable high throughput in the manufacturing platform 1. In some embodiments, each exposure tool 40 exposes one substrate at a time at a high rate, such as greater than 100 wafers per hour (WPH). By processing many substrates simultaneously during earlier and later process steps, the manufacturing platform 1 may take advantage of the high process speed of the one or more exposure tools 40 to achieve an overall high throughput of greater than 100 WPH to match the exposure WPH.

Following the exposure process, the substrate may be transferred by the TMs 14 and 12 to one or more developer/bake modules 42 where the dry resist may be developed/baked according to the radiation pattern of the exposure process. In some embodiments, the developer/bake modules 42 are parts of the respective exposure tools 40. The one or more developer/bake modules 42 may develop and/or bake multiple substrates to enable high throughput in the manufacturing platform 1. The developer modules can be wet or dry based.

Next, the substrate is transferred by the TMs 14 and 12 to one or more etch modules 20, 22, 24 for removal of exposed or unexposed portions of the dry resist film by an etch process to form a dry resist mask on the substrate. The etch process may be a dry etch or a wet etch. The one or more etch modules 20, 22, 24 may etch multiple substrates simultaneously to enable high throughput in the manufacturing platform 1. Thereafter, the substrate may be removed from the manufacturing platform 1 through the EFEMs 10 or 11. In another example, following formation of a dry resist mask on the substrate, a film may be selectively deposited on exposed materials in the one or more deposition modules 30, 32, 34.

FIG. 2A illustrates a manufacturing platform 2 in a cross-sectional view, in accordance with some embodiments. FIG. 2B illustrates a mini-batch module 70 of the manufacturing platform 2. The manufacturing platform 2 is similar to the manufacturing platform 1 (see above, FIG. 1) and includes one or more mini-batch modules 70, 72, 74, 76, 78, 80 for depositing a dry resist on the substrates. The one or more mini-batch modules 70, 72, 74, 76, 78, 80 are multi-wafer modules configured for simultaneously processing substrates that are vertically stacked (e.g., 25 to 50 vertically stacked substrates) on plates 71. Multiple wafers are stacked vertically one above the other separated by gaps and processed in a horizontal orientation. Deposition on backsides of the wafers may be reduced or prevented by using respective individual plates 71 for each wafer being processed. The manufacturing platform 2 with mini-batch modules 70, 72, 74, 76, 78, 80 enables high throughput, such as greater than 200 WPH.

Next, referring to FIGS. 3A-3D, steps of an example fabrication process including formation, patterning, and development of a dry resist as a EUV-sensitive photoresist film are described. FIGS. 3A-3D illustrate cross-sectional views of an example substrate 100 during a fabrication process for forming a dry resist on the substrate followed by EUV lithographic patterning in accordance with various embodiments.

Figure 3A:
FIGS. 3A-3D illustrate intermediate steps of a fabrication process including a dry resist, in accordance with some embodiments.

FIG. 3A illustrates a cross-sectional view of the substrate 100 to be patterned. For example, the substrate 100 may be a silicon wafer having a diameter in a range of 100 mm to 500 mm, such as a diameter of 150 mm, 200 mm, 300 mm, or 450 mm. In various embodiments, the substrate 100 may be a part of, or include, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise silicon germanium, silicon carbide, gallium arsenide, gallium nitride, or other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device. For example, the substrate 100 may have a film deposited over it in one of the 30, 32, 34. The film may subsequently be patterned using a subsequently patterned dry resist (see below, FIGS. 3B-3D) as a mask. Next, the substrate 100 is transferred by one of the TMs 12, 14, 16, 18 into one of the resist deposition modules 50, 52, 54, 56, 58, 60 for depositing a dry resist on the substrate 100.

Figure 3B:
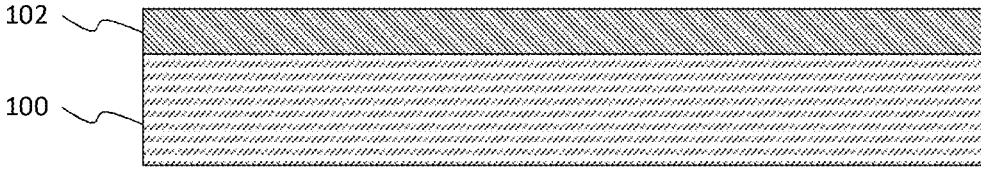

FIG. 3B illustrates a cross-sectional view of the substrate 100 after depositing a dry resist 102 over the substrate 100. As illustrated in FIG. 3B, in one example the dry resist 102 is formed on the surface of the substrate 100. In various embodiments, although not illustrated, the substrate 100 may further comprise various layers useful for semiconductor device fabrication, which may be collectively regarded as a part of the substrate 100 in this disclosure. For example, in some embodiments, there may be a dielectric layer over the substrate 100 comprising a silicon-based dielectric material with a low dielectric constant (i.e., low-k value) such as organosilicate glass (SiCOH), dense SiCOH, porous SiCOH, and other porous dielectric materials. Further, there may be a hard mask layer over the substrate 100, which may be patterned in subsequent etch processes after the EUV photopatterning. In various embodiments, the hard masks comprise titanium nitride, titanium, titanium oxide, tantalum, tungsten carbide, other tungsten based compounds, ruthenium based compounds, or aluminum based compounds. The hard mask may also include carbon-based or silicon-based mask materials. In addition, the dry resist 102 may be formed as a part of a multi-layer stack commonly used for photolithographic patterning. The multi-layer stack may be used to generate and transfer a pattern to the hard mask and then to underlying layers such as the dielectric layer of the substrate 100. In various embodiments, the multi-layer stack comprises an underlayer and the dry resist 102 over the underlayer as an EUV-sensitive photoresist. In one or more embodiments, the underlayer comprises carbon materials (e.g., silicon carbide or silicon oxycarbide) and may be formed via a spin-on process or vapor deposition such as CVD. The multi-layer stack may further comprise layers of oxide (e.g., silicon oxide) or nitride (e.g., titanium nitride or silicon nitride) above the underlayer and the dry resist 102. For simplicity of illustration, FIGS. 3A-3D illustrates only the dry resist 102 directly deposited on the substrate 100, but as described above, any suitable multi-layer structure may be present as a part of the substrate 100 in various embodiments.

In various embodiments, the dry resist 102 comprises tin (Sn), antimony (Sb), hafnium (Hf), zirconium (Zr), zinc (Zn), the like, or a combination thereof. In certain embodiments, the dry resist 102 comprises a metal oxide, a metal alkoxide, or a methacrylate (MAA) of Sn, Sb, Hf, Zr, Zn, or the like, such as ZrMAA, SbMAA, SbMAA:F, HfMAA, ZnMAA, and ZnMAA:F.

In various embodiments, after forming the dry resist 102 over the substrate 100, the substrate is transferred by the TMs 18 and 16 to a developer/bake module 42 and a post-apply bake (PAB) is performed to remove any excess solvents from a wet process, residual volatile byproducts from a dry process, or both. In certain embodiments, the PAB may be performed by heating the substrate 100 in the developer/bake module 42 at a temperature in a range of 50° C. to 450° C., in vacuum or under a gas flow. Next, the substrate 100 is transferred by the TMs 18 and 16 to an exposure tool 40.

Figure 3C:
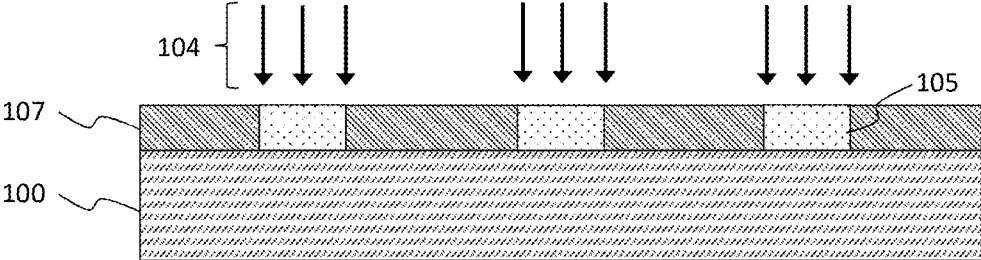

FIG. 3C illustrates a cross-sectional view of the substrate 100 after an EUV exposure in an exposure tool 40. The method further includes, as schematically illustrated in FIG. 3C, exposing the substrate 100 to an EUV light pattern 104. A photomask may be used to create the EUV light pattern 104. In response to the exposure to the EUV light pattern 104, a photoreaction may occur in exposed regions 105 of the dry resist 102, while unexposed regions 107 remain unchanged. As a result of the photoreaction, the exposed regions 105 may comprise a cross-linked dry resist, which may have material properties substantially different from the unreacted portion of the dry resist 102 (i.e., the unexposed regions 107). Such a difference in the material properties includes volatility, reactivity, and/or solubility among others, which gives origin to the tonality as a photoresist.

Figure 3D:
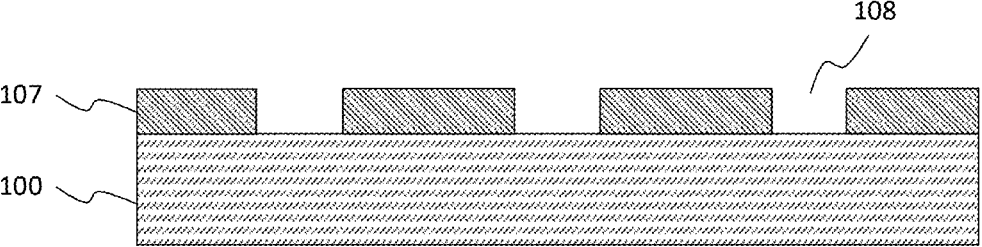

FIG. 3D illustrates a cross-sectional view of the substrate 100 after a developing step. The substrate 100 is transferred by the TMs 18 and 16 to a developer/bake module 42 for a developing step and is then by the TMs 14 and 12 to one of the etch modules 20, 22, 24 for an etch step. In FIG. 3D, the exposed regions 105 are developed and removed by a dry etch or a wet etch process to form a patterned dry resist mask containing the unexposed regions 107 and openings 108 that expose the underlying substrate 100. Conventionally, a photoresist may be removed in a wet process by treating the substrate with a developing solution to dissolve the reacted (in case of a positive tone resist) or unreacted (in case of a negative tone resist) regions of the photoresist. A similar wet process may be applied for the development of the dry resist 102 in various embodiments. Alternately, a dry process may be used in other embodiments. The dry process may comprise, for example, a selective plasma etch process or a thermal process, advantageously eliminating the use of a developing solution. In certain embodiments, the dry process may be performing using reactive ion etching (RIE) process or atomic layer etching (ALE). Thereafter, the openings 108 may be used in an etching process to etch features in the substrate 100. In certain embodiments, dry processes for the formation and developing of the dry resist 102 may allow better process control at the nanoscale than a wet process, e.g., for forming features that are a few nanometers or sub-nanometer in critical dimension.

In various embodiments, after the EUV exposure (FIG. 3C) and prior to the developing step (FIG. 3D), the substrate 100 is transferred to a developer/bake module 42 and a post-exposure bake (PEB) is performed to further differentiate the material properties between the exposed regions 105 and the unexposed regions 107. In certain embodiments, the PEB may be performed by heating the substrate 100 in the developer/bake module 42 at a temperature in a range of 70° C. to 450° C., such as in a range of 180° C. to 225° C., in vacuum or under a gas flow.

In the embodiments described above referring to FIGS. 3A-3D, the dry resist 102 is a negative-tone photoresist. In other embodiments, the dry resist 102 may form a positive-tone photoresist, where the exposed regions 105 may be removed by the developing step and the unexposed regions 107 remain. In one embodiment, the positive-tone photoresist may be enabled by performing an additional chemical treatment such as polymerization to increase an etch resistance of the unexposed regions 107 after the EUV exposure, while the photoreaction in the exposed regions 105 reduces the etch resistance. Additionally, positive tone may be enabled by performing a selective deposition process to reduce the etch resistance of the dry resist 102.

Figure 4:
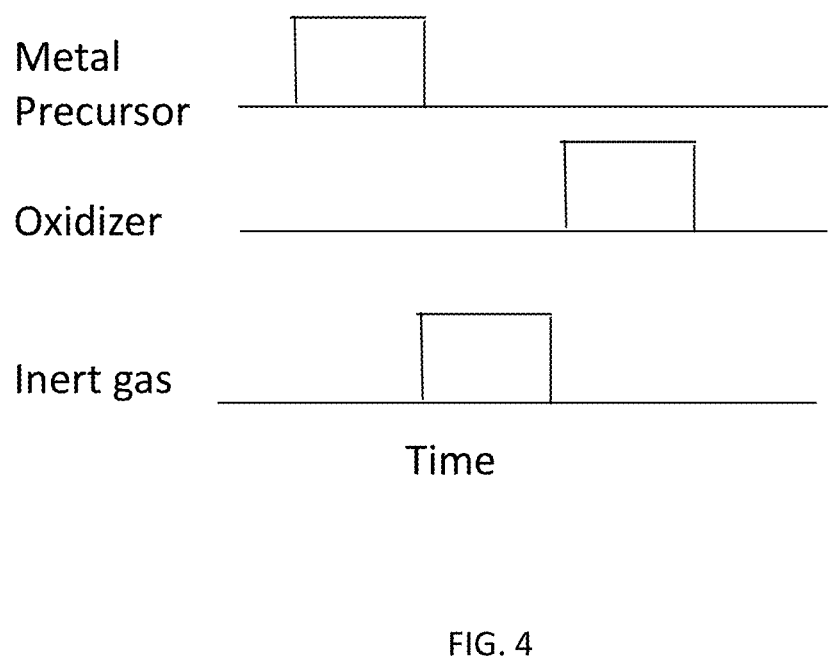

FIG. 4 illustrates flow rates of a deposition process for forming a dry resist 102 on a substrate 100 (see above, FIG. 3B), in accordance with some embodiments. In certain embodiments, the deposition process for the dry resist 102 comprises exposing the substrate 100 to two precursors in a process chamber (e.g., one of the resist deposition modules 50, 52, 54, 56, 58, 60). The two precursors may be a metal precursor (e.g., a gas containing one or more metals) and an oxidizer or oxidizing agent (e.g., an oxygen-containing precursor). The exposures to these precursors may be performed stepwise or simultaneously.

In various embodiments, the deposition process is an ALD, pseudo-ALD, CVD, PEALD, or PECVD process and comprises two or more exposing steps. For example, as illustrated in FIG. 4, the deposition process is performed by first exposing the substrate 100 by flowing the metal-containing precursor to form an adsorbed layer on the substrate 100. As an example for when the metal is antimony (Sb), the metal-containing precursor may be alkylamine based (e.g., tris(dimethylamido)antimony, $(Me_2N)_3Sb$), alkoxide-based (e.g., $Sb(OEt)_3$), or halide-based (e.g., $SbCl_3$).

Next, the flow of the metal-containing precursor is ended and the process chamber is purged by flowing an inert gas (e.g., argon or nitrogen $(N_2)$) to remove remaining traces of the metal-containing precursor. The process chamber may be evacuated before and/or after the purge step with the inert gas.

Thereafter, the oxygen-containing precursor gas is flowed into the chamber to expose the adsorbed layer of the metal-containing precursor on the substrate 100. The oxygen-containing precursor may be glycerol, ethylene glycol, ethanol, isopropyl alcohol, quinone, $O_3$, CO, $CO_2$, the like, or a combination thereof. In some embodiments, a halogen (e.g, fluorine) is added to one or more of the process gases to enhance adsorption. The adsorbed layer of the metal-containing precursor reacts with the oxygen-containing precursor gas to form a layer of metal oxide, metal alkoxide, methacrylate (MAA) of Sb, Hf, Zr and Zn, or the like, for the dry resist 102.

In some embodiments, the oxygen-containing precursor is a metal alkoxide. For example, when the metal is antimony (Sb), the metal-containing precursor can be $(Me_2N)_3Sb$ and the oxygen-containing precursor can be $Sb(OEt)_3$. In this case, the oxygen-containing precursor (which also contains Sb) can be flowed into the chamber before or after the metal-containing precursor, and a metal oxide can be formed on the substrate 100 by the reaction of the metal-containing precursor with the metal alkoxide without the addition of another oxidizer. Additional carbon can be added by flowing a tertiary carbon-containing gas.

The exposing steps may be repeated one or more times to increase a thickness of the dry resist 102 on the substrate 100. In certain embodiments, the exposing steps may be separated temporally or spatially. Temporally separating the exposing steps may be realized by changing the gas composition in a process chamber, as described above with respect to the process illustrated by FIG. 4. On the other hand, spatially separating the exposing steps may be enabled by utilizing multiple spatially segregated sections within the process chamber and transporting the substrate 100 from one section to another. Temporally separating the exposing steps of the vapor may further include evacuating, purging, or both evacuating and purging, the process chamber between the exposing steps, as described above with respect to the process illustrated by FIG. 4. These additional steps may be beneficial in ensuring the reaction occurs only on surface and not in the gas phase. The ALD or pseudo-ALD method in accordance with this embodiment may be particularly advantageous in enabling layer-by-layer growth of the dry resist 102 with a high uniformity.

In another embodiment, instead of an ALD type process, the metal-containing precursor and oxygen-containing precursor may be supplied in the process chamber simultaneously to grow the dry resist 102. Such an embodiment may be advantageous by allowing the continuous growth of the dry resist 102 in a single step. In this embodiments, the reaction between the precursors may or may not occur in the gas phase as well as on surface.

In other embodiments, the dry resist 102 may be deposited by liquid deposition using alternate exposures of a metal-containing precursor liquid and an oxygen-containing precursor liquid. The liquid deposition may further include rinsing the substrate with a rinsing solution to remove an excess amount and/or unreacted portion of the precursors between the exposing steps. The rinsing solution may comprise deionized water, common organic solvents such as acetone and isopropanol, or mixtures thereof. In another embodiment, the liquid precursors may be mixed first and the mixture solution may be applied to the substrate to grow the dry resist 102. In one or more embodiments, one of the precursors may be gaseous and another of the precursors may be liquid, and accordingly two different modes (vapor and liquid) of delivery may be utilized to perform the deposition process.

FIG. 5 illustrates a flowchart of a method 200 for operating a manufacturing platform 1, in accordance with some embodiments. Step 202 includes moving a substrate 100 through a manufacturing platform 1 using one or more transfer modules (TMs) 12, 14, 16, 18, as described above with respect to FIG. 1. Step 204 includes depositing a dry resist 102 on the substrate 100 using a resist deposition module of the one or more resist deposition modules 50, 52, 54, 56, 58, 60, as described above with respect to FIGS. 1, 3B, and 4. Step 206 includes examining the substrate 100 for distortion with a metrology system, as described above with respect to FIG. 1. The metrology system may be part of a transfer module of the one or more transfer modules 12, 14, 16, 18. Step 208 includes exposing the dry resist 102 to UV or EUV radiation using an exposure tools of the one or more exposure tools 40, as described above with respect to FIGS. 1 and 3D. Step 210 includes removing exposed portions of the dry resist 102 in exposed regions 105 or unexposed portions of the dry resist 102 in unexposed regions 107 using an etch module of the one or more etch modules 20, 22, 24.

FIG. 6 illustrates a flowchart of a method 300 for an exposure process, in accordance with some embodiments. Step 302 includes forming a film under vacuum condition over a substrate 100 in a deposition module of the one or more deposition modules 30, 32, 34, as described above with respect to FIG. 1. Step 304 includes moving the substrate 100 from the deposition module of the one or more deposition modules 30, 32, 34 to a resist deposition module of the one or more resist deposition modules 50, 52, 54, 56, 58, 60 with a transfer module of the one or more transfer modules (TMs) 12, 14, 16, 18, as described above with respect to FIG. 1. Step 306 includes depositing a dry resist 102 comprising a metal and oxygen over the substrate 100 in the resist deposition module, as described above with respect to FIGS. 1, 3B, and 4. Step 308 includes examining the substrate for distortion with a metrology system that is part of the transfer module, as described above with respect to FIG. 1. Step 310 includes moving the substrate 100 to an exposure tool 40 with the transfer module, where the exposure tool 40 exposes the dry resist 102 to UV or EUV radiation, as described above with respect to FIGS. 1 and 3D. The substrate 100 has been in vacuum from forming the film to exposing the dry resist 102.

Example embodiments of the disclosure are summarized here. Other embodiments can also be understood from the entirety of the specification as well as the claims filed herein.

Example 1. A manufacturing platform, including: one or more transfer modules for moving a substrate through the manufacturing platform, where a transfer module of the one or more transfer modules includes a metrology system configured to measure distortion of the substrate; one or more resist deposition modules for depositing a dry resist on the substrate; one or more exposure tools for exposing the dry resist to UV or EUV radiation; and one or more etch modules for removal of exposed or unexposed portions of the dry resist by a dry etch process to form a mask on the substrate.

Example 2. The manufacturing platform of example 1, further including one or more developer/bake modules, where the one or more developer/bake modules are wet based or dry based.

Example 3. The manufacturing platform of one of examples 1 or 2, where the one or more resist deposition modules are configured for each simultaneously processing multiple substrates.

Example 4. The manufacturing platform of one of examples 1 to 3, where the one or more resist deposition modules are configured for each simultaneously processing multiple substrates that are vertically stacked.

Example 5. The manufacturing platform of one of examples 1 to 4, where the one or more resist deposition modules are configured for depositing a metal oxide dry resist or a metal alkoxide dry resist on the substrate.

Example 6. The manufacturing platform of example 5, where the metal oxide dry resist or the metal alkoxide dry resist includes tin (Sn), antimony (Sb), hafnium (Hf), zirconium (Zr), or zinc (Zn).

Example 7. The manufacturing platform of one of examples 5 or 6, where the metal alkoxide dry resist is deposited using an oxidizing agent including glycol.

Example 8. The manufacturing platform of one of examples 5 to 7, where the metal alkoxide dry resist is deposited using an oxidizing agent including a metal alkoxide.

Example 9. The manufacturing platform of one of examples 5 to 8, where the metal alkoxide dry resist includes tin alkoxide or antimony alkoxide.

Example 10. A method of operating a manufacturing platform, the method including: moving a substrate through the manufacturing platform using one or more transfer modules; depositing a dry resist on the substrate using a resist deposition modules of the manufacturing platform; examining the substrate for distortion with a metrology system, where the metrology system is part of a transfer module of the one or more transfer modules; exposing the dry resist to UV or EUV radiation using an exposure tool of the manufacturing platform; and removing exposed or unexposed portions of the dry resist using an etch module of the manufacturing platform.

Example 11. The method of example 10, where the dry resist includes a metal oxide dry resist or a metal alkoxide dry resist.

Example 12. The method of example 11, where the metal oxide dry resist or the metal alkoxide dry resist includes tin (Sn), antimony (Sb), hafnium (Hf), zirconium (Zr), or zinc (Zn).

Example 13. The method of one of examples 11 or 12, where the metal alkoxide dry resist is deposited using an oxidizing agent that includes glycol.

Example 14. The method of one of examples 11 to 13, where the metal alkoxide dry resist includes tin alkoxide or antimony alkoxide.

Example 15. A method of an exposure process, the method including: forming a film over a substrate in a deposition module, where the film is formed in vacuum; moving the substrate from the deposition module to a resist deposition module with a transfer module; depositing a dry resist over the substrate in the resist deposition module, the dry resist including a metal and oxygen; examining the substrate for distortion with a metrology system, where the metrology system is part of the transfer module; and moving the substrate to an exposure tool with the transfer module, where the exposure tool exposes the dry resist to UV or EUV radiation, where the substrate has been in vacuum from forming the film to exposing the dry resist.

Example 16. The method of example 15, where depositing the dry resist includes flowing a metal-containing precursor and an oxygen-containing precursor over the substrate.

Example 17. The method of example 16, where the metal-containing precursor includes antimony.

Example 18. The method of one of examples 16 or 17, where the oxygen-containing precursor includes antimony alkoxide.

Example 19. The method of one of examples 16 to 18, where the metal-containing precursor includes an alkoxide.

Example 20. The method of one of examples 15 to 19, further including examining the substrate with optical metrology for thickness measurement, roughness measurement, critical dimension measurement, or carbon content measurement, where the optical metrology is part of the transfer module.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method of operating a manufacturing platform, the method comprising:

moving a substrate through the manufacturing platform using one or more transfer modules;

depositing a dry resist on the substrate using a resist deposition module of the manufacturing platform;

examining the substrate for bow distortion with a metrology system, wherein the metrology system is part of a transfer module of the one or more transfer modules;

correcting the bow distortion by applying pressure to portions of the substrate with one or more actuators;

exposing the dry resist to UV or EUV radiation using an exposure tool of the manufacturing platform; and removing exposed or unexposed portions of the dry resist using an etch module of the manufacturing platform.

2. The method of claim 1, wherein the dry resist comprises a metal oxide dry resist or a metal alkoxide dry resist.

3. The method of claim 2, wherein the metal oxide dry resist or the metal alkoxide dry resist comprises tin (Sn), antimony (Sb), hafnium (Hf), zirconium (Zr), or zinc (Zn).

4. The method of claim 2, wherein the metal alkoxide dry resist is deposited using an oxidizing agent that comprises glycol.

5. The method of claim 2, wherein the metal alkoxide dry resist comprises tin alkoxide or antimony alkoxide.

6. A method of an exposure process, the method comprising:

forming a film over a substrate in a deposition module, wherein the film is formed in vacuum;

moving the substrate from the deposition module to a resist deposition module with a transfer module;

depositing a dry resist over the substrate in the resist deposition module, the dry resist comprising a metal and oxygen;

examining the substrate for bow with a metrology system, wherein the metrology system is part of the transfer module;

applying pressure to portions of the substrate to correct the bow with one or more actuators; and moving the substrate to an exposure tool with the transfer module, wherein the exposure tool exposes the dry resist to UV or EUV radiation, wherein the substrate has been in vacuum from forming the film to exposing the dry resist.

7. The method of claim 6, wherein depositing the dry resist comprises flowing a metal-containing precursor and an oxygen-containing precursor over the substrate.

8. The method of claim 7, wherein the metal-containing precursor comprises antimony.

9. The method of claim 7, wherein the oxygen-containing precursor comprises antimony alkoxide.

10. The method of claim 7, wherein the metal-containing precursor comprises an alkoxide.

11. The method of claim 6, further comprising examining the substrate with optical metrology for thickness measurement, roughness measurement, critical dimension measurement, or carbon content measurement, wherein the optical metrology is part of the transfer module.

12. A method of operating a manufacturing platform, the method comprising:

forming a film over a substrate in a deposition module, the film being formed under vacuum conditions;

moving the substrate through the manufacturing platform using one or more transfer modules while maintaining vacuum conditions;

depositing a dry resist on the substrate using a resist deposition module of the manufacturing platform while maintaining vacuum conditions, wherein depositing the dry resist comprises:

flowing a metal-containing precursor over the substrate;

purging the resist deposition module of the metal-containing precursor by flowing an inert gas; and flowing an oxygen-containing precursor over the substrate after purging the resist deposition module of the metal-containing precursor;

examining the substrate for distortion with an optical metrology system while maintaining vacuum conditions, the optical metrology system being part of a transfer module of the one or more transfer modules;

correcting the distortion by applying pressure to portions of the substrate with one or more actuators;

exposing the dry resist to UV or EUV radiation using an exposure tool of the manufacturing platform while maintaining vacuum conditions; and removing exposed or unexposed portions of the dry resist using an etch module of the manufacturing platform while maintaining vacuum conditions.

13. The method of claim 12, further comprising examining the substrate for thickness measurement with the optical metrology system.

14. The method of claim 12, further comprising examining the substrate for roughness measurement with the optical metrology system.

15. The method of claim 12, further comprising examining the substrate for critical dimension measurement with the optical metrology system.

16. The method of claim 12, further comprising examining the substrate for carbon content measurement with the optical metrology system.

17. The method of claim 12, wherein the metal-containing precursor comprises antimony.

18. The method of claim 12, wherein the oxygen-containing precursor comprises antimony alkoxide.

19. The method of claim 12, wherein the metal-containing precursor comprises an alkoxide.

20. The method of claim 12, further comprising adding fluorine to the oxygen-containing precursor.

* * * * *